United States Patent
Ting et al.

(10) Patent No.: US 7,524,716 B2
(45) Date of Patent: Apr. 28, 2009

(54) FABRICATING METHOD OF SEMICONDUCTOR STRUCTURE

(75) Inventors: Shyh-Fann Ting, Gangshan Township, Kaohsiung County (TW); Cheng-Tung Huang, Kaohsiung (TW); Wen-Han Hung, Kaohsiung (TW); Li-Shian Jeng, Taitung (TW); Kun-Hsien Lee, Tainan (TW); Tzyy-Ming Cheng, Hsinchu (TW); Jing-Chang Wu, Douliou (TW); Tzermin Shen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/755,669

(22) Filed: May 30, 2007

(65) Prior Publication Data

US 2007/0238241 A1    Oct. 11, 2007

Related U.S. Application Data

(62) Division of application No. 11/399,827, filed on Apr. 7, 2006, now Pat. No. 7,288,822.

(51) Int. Cl.
*H01L 21/336* (2006.01)

(52) U.S. Cl. .................. 438/197; 438/199; 438/231; 438/300; 257/E21.585

(58) Field of Classification Search ................. 438/197, 438/300, 607, 199, 230, 231
See application file for complete search history.

(56) References Cited

U.S. PATENT DOCUMENTS

| 7,238,580 | B2 * | 7/2007 | Orlowski et al. | 438/300 |
| 2005/0035470 | A1 * | 2/2005 | Ko et al. | 257/900 |
| 2006/0086987 | A1 * | 4/2006 | Chen et al. | 257/369 |

* cited by examiner

*Primary Examiner*—Michael Trinh
(74) *Attorney, Agent, or Firm*—J.C. Patents

(57) ABSTRACT

A semiconductor structure is disclosed, including a substrate having therein a first well of a first conductivity type and a second well of a second conductivity type, a first MOS transistor of the first conductivity type and a second MOS transistor of the second conductivity type. The first MOS transistor is disposed on the second well, including a gate structure on the second well and a strained layer of the first conductivity type in an opening in the second well beside the gate structure. The difference between the cell parameter of a portion of the strained layer near the bottom of the opening and that of the substrate is less than the difference between the cell parameter of a portion of the strained layer apart from the bottom of the opening and that of the substrate. The second MOS transistor is disposed on the first well.

8 Claims, 8 Drawing Sheets

FABRICATING METHOD OF SEMICONDUCTOR STRUCTURE

CROSS-REFERENCE TO RELATED APPLICATION

This application is a divisional of, and claims the priority benefit of, U.S. application Ser. No. 11/399,827 U.S. Pat. No. 7,288,822 filed on Apr. 7, 2006.

BACKGROUND OF THE INVENTION

1. Field of the Invention

The present invention relates to a semiconductor structure and fabrication of the same. More particularly, the present invention relates to a semiconductor structure having a doped strained layer as a source/drain and a method for fabricating the same.

2. Description of the Related Art

Metal-oxide-semiconductor (MOS) transistors are essential to VLSI and ULSI circuits, and are widely used in microprocessors, semiconductor memory devices and power devices, etc., as basic constituent units. In some nanometer processes, the speed of a MOS transistor is increased by forming an opening in the substrate beside the gate structure and then filling the opening with a doped strained material as a source/drain (S/D) region to increase the carrier mobility of the S/D region.

FIGS. 1A-1B illustrate a process flow of fabricating a prior-art MOS transistor in a cross-sectional view. Referring to FIG. 1A, a substrate 100 with a well 101 therein is provided, and then a gate structure 102 including gate dielectric 104 and a gate 106 is formed on the well 101, A spacer 108 is formed on the sidewall of the gate structure 102, and then etching is conducted with the gate structure 102 and the spacer 108 as a mask to remove a portion of the exposed substrate 100 and form an opening 110.

Referring to FIG. 1B, a doped strained layer 112 is formed in the opening 110 to serve as an S/D region, wherein a portion 113 of the doped strained layer 112 is above the surface of the substrate 100. A (self-aligned silicide) salicide layer 114 is then formed on the gate structure 102 and the doped strained layer 112.

Because the top surface of the doped strained layer 112 is higher than that of the substrate 100, the stress caused by the salicide layer 114 is decreased. When the MOS transistor is PMOS, for example, to increase the compressive stress in the strained layer 112, a SiGe layer with a Ge-content higher than 20% is formed as the strained layer 112, or the thickness of the same is increased by increasing the depth of the opening 110.

However, the thickness of a strained SiGe layer decreases with increase in the Ge-content thereof. Moreover, when the Ge-content is higher, the cell parameter of the SiGe layer is larger making the difference between the cell parameter of the SiGe layer and that of the substrate larger, so that defects easily occur at the interface of the SiGe layer and the substrate lowering the device performance. Furthermore, in a subsequent salicide process, the Ge-atoms will enter the metal silicide layer degrading its quality.

SUMMARY OF THE INVENTION

Accordingly, this invention provides a semiconductor structure that includes a doped strained layer with a non-uniform cell parameter distribution as an S/D region for decreasing the difference between the cell sizes of the S/D region and the substrate and thereby prevents defects from occurring at the interface of the two.

The semiconductor structure includes a substrate having therein a first well of a first conductivity type and a second well of a second conductivity type, a first MOS transistor of the first conductivity type and a second MOS transistor of the second conductivity type. The first MOS transistor is disposed on the second well, including a first gate structure on the second well and a first strained layer of the first conductivity type in a first opening in the second well beside the first gate structure. The difference between the cell parameter of a portion of the first strained layer near the bottom of the first opening and the cell parameter of the substrate is smaller than the difference between the cell parameter of a portion of the first strained layer apart from the bottom of the first opening and the cell parameter of the substrate. The second MOS transistor is on the first well.

In a preferred embodiment, the cell parameter of the first strained layer has a gradient distribution.

In embodiments where the first conductivity type is P-type, the cell parameter of a portion of the first strained layer near the bottom of the first opening is smaller than that of a portion of the first strained layer apart from the bottom of the first opening. The material of such a first strained layer may be SiGe. In embodiments where the first conductivity type is N-type, the cell parameter of a portion of the first strained layer near the bottom of the first opening is larger than that of a portion of the first strained layer apart from the bottom of the first opening. The material of such a first strained layer may be SiC.

In some embodiments, the above second MOS transistor includes a second gate structure on the first well and an S/D region of the second conductivity type in the first well beside the second gate structure. The above semiconductor structure may further include a silicon layer on the first strained layer and a metal silicide layer on the silicon layer, the S/D region and the first and the second gate structures.

In some embodiments, the above second MOS transistor includes a second gate structure on the first well and an S/D region of the second conductivity type around and under a second opening in the first well beside the second gate structure. The above semiconductor structure may also include a silicon layer on the first strained layer and a metal silicide layer on the silicon layer, the S/D region and the two gate structures.

In some embodiments, the above second MOS transistor includes a second gate structure on the first well and a second strained layer of the second conductivity type in a second opening in the first well beside the second gate structure. The difference between the cell parameter of a portion of the second strained layer near the bottom of the second opening and the cell parameter of the substrate is smaller than the difference between the cell parameter of a portion of the second strained layer apart from the bottom of the second opening and the cell parameter of the substrate. When the first conductivity type is P-type and the second one N-type, the cell parameter of a portion of the first strained layer near the bottom of the first opening is smaller than that of a portion of the first strained layer apart from the bottom of the first opening, but the cell parameter of a portion of the second strained layer near the bottom of the second opening is larger than that of a portion of the second strained layer apart from the bottom of the second opening. When the first conductivity type is N-type and the second one P-type, the cell parameter of a portion of the first strained layer near the bottom of the first opening is larger than that of a portion of the first strained layer apart from the bottom of the first opening, but the cell parameter of a portion of the second strained layer near the bottom of the second opening is smaller than that of a portion of the second strained layer apart from the bottom of the second opening. The cell parameter of the second strained layer may also have a gradient distribution. In addition, the semiconductor structure may further include a silicon layer on the first strained layer and the second strained layer, and a metal silicide layer on the silicon layer and the first and the second gate structures.

The method for fabricating a semiconductor structure of this invention is described as follows. A substrate having therein a first well of a first conductivity type and a second well of a second conductivity type is provided, and then a first gate structure is formed on the second well. A portion of the substrate beside the first gate structure is removed to form a first opening, and then a first epitaxy process is performed with a first mixed gas to form in the first opening a first strained layer containing silicon and a first IV-group element. The first mixed gas includes a first gas containing silicon and a second gas containing the first IV-group element, and the percentage of the second gas in the first mixed gas is increased with time during the first epitaxy process. In addition, a MOS transistor of the second conductivity type is formed on the first well.

In embodiments where the first conductivity type is P-type, the atomic size of the first IV-group element is larger than that of silicon increasing the cell parameter, so that the first strained layer of P-type is subject to a compressive stress raising the hole mobility. In embodiments where the first conductivity type is N-type, the first IV-group element is carbon that has an atomic size smaller than that of silicon decreasing the cell parameter, so that the first strained layer of N-type is subject to a tensile stress raising the electron mobility.

In a preferred embodiment, the first mixed gas further includes a first doping gas so that the first strained layer is formed having the first conductivity type. The MOS transistor of the second conductivity type may be formed by forming a second gate structure on the first well and then forming an S/D region of the second conductivity type in the first well beside the second gate structure. In addition, a silicon layer may be further formed on the first strained layer, and then a metal silicide layer may be formed on the silicon layer, the S/D region and the first and the second gate structures.

In some embodiments, the MOS transistor of the second conductivity type may be formed with the following steps. A second gate structure is formed on the first well, a portion of the substrate beside the second gate structure is removed to form a second opening, and then an S/D region of the second conductivity type is formed in the first well around and under the second opening. Similarly, a silicon layer may be further formed on the first strained layer, and then a metal silicide layer may be formed on the silicon layer, the S/D region and the first and the second gate structures.

In still some embodiments, the MOS transistor is formed with the following steps. A second gate structure is formed on the first well, a portion of the substrate beside the second gate structure is removed to form a second opening, and then a second epitaxy process is performed with a second mixed gas to form in the second opening a second strained layer containing silicon and a second IV-group element. The second mixed gas includes the first gas containing silicon and a third gas containing the second IV-group element, and the percentage of the third gas in the second mixed gas is increased with time during the second epitaxy process. When the first conductivity type is P-type and the second one N-type, the atomic size of the first IV-group element is larger than that of silicon but the second IV-group element is carbon that has an atomic size smaller than that of silicon. When the first conductivity type is N-type and the second one P-type, the first IV-group element is carbon that has an atomic size smaller than that of silicon but the atomic size of the second IV-group element is larger than that of silicon.

In a preferred embodiment, the second mixed gas further includes a second doping gas so that the second strained layer is formed having the second conductivity type. In addition, a silicon layer may be further formed on the first strained layer and the second strained layer, and then a metal silicide layer may be formed on the silicon layer and the first and the second gate structures.

Accordingly, in the epitaxy process for forming a strained layer as an S/D region in this invention, the percentage of the gas containing the non-silicon IV-group element in the mixed gas is increased with time. Thereby, the difference between the cell size of a portion of the strained layer near the bottom of the opening and the cell size of the substrate is smaller than the difference between the cell size of a portion of the strained layer apart from the bottom of the opening and the cell size of the substrate. Thus, less defects occur at the interface of the strained layer and the substrate. Moreover, since a silicon layer is formed on the strained layer before the metal silicide layer is formed, the non-silicon IV-group element does not enter the metal silicide layer in the salicide process, so that the quality of the metal silicide layer is not degraded.

It is to be understood that both the foregoing general description and the following detailed description are exemplary, and are intended to provide further explanation of the invention as claimed.

DESCRIPTION OF THE PREFERRED EMBODIMENTS

Figure 1A:
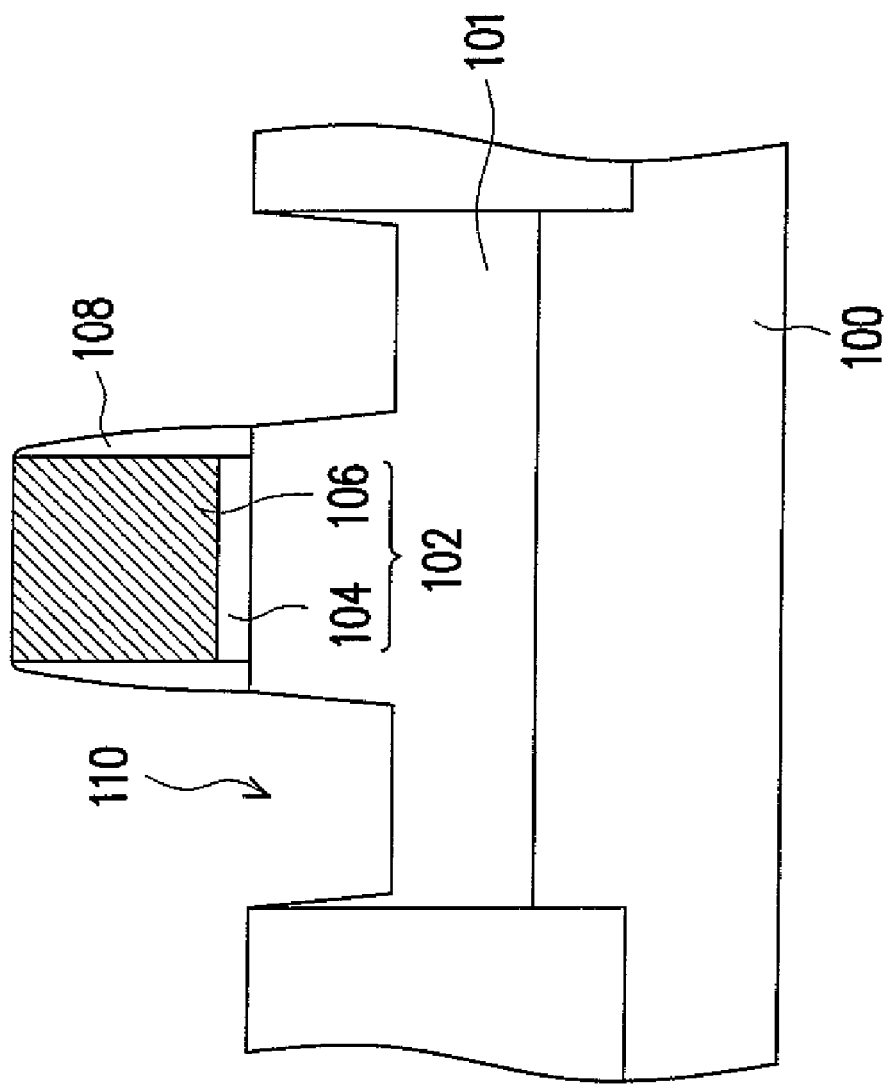
FIGS. 1A-1B illustrate a process flow of fabricating a prior-art MOS transistor in a cross-sectional view.
Figure 1B:
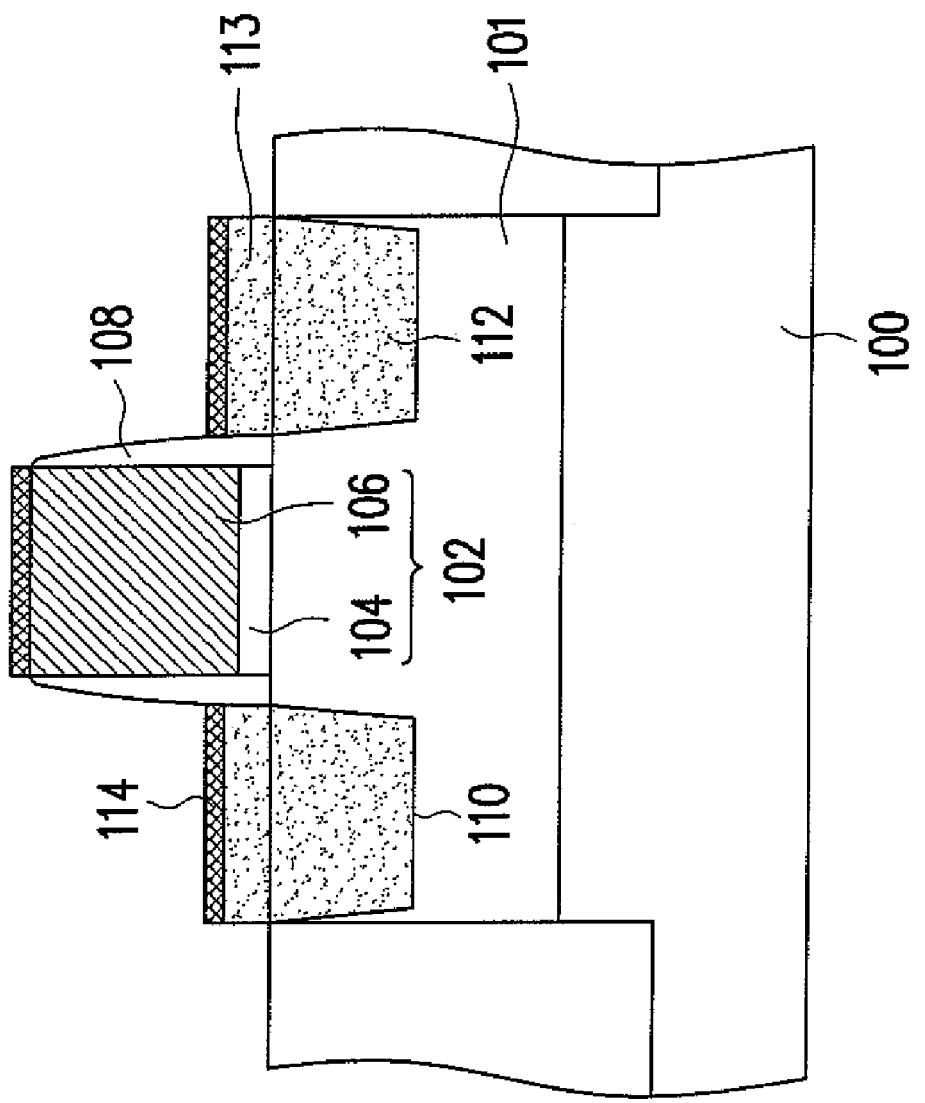
Figure 2:
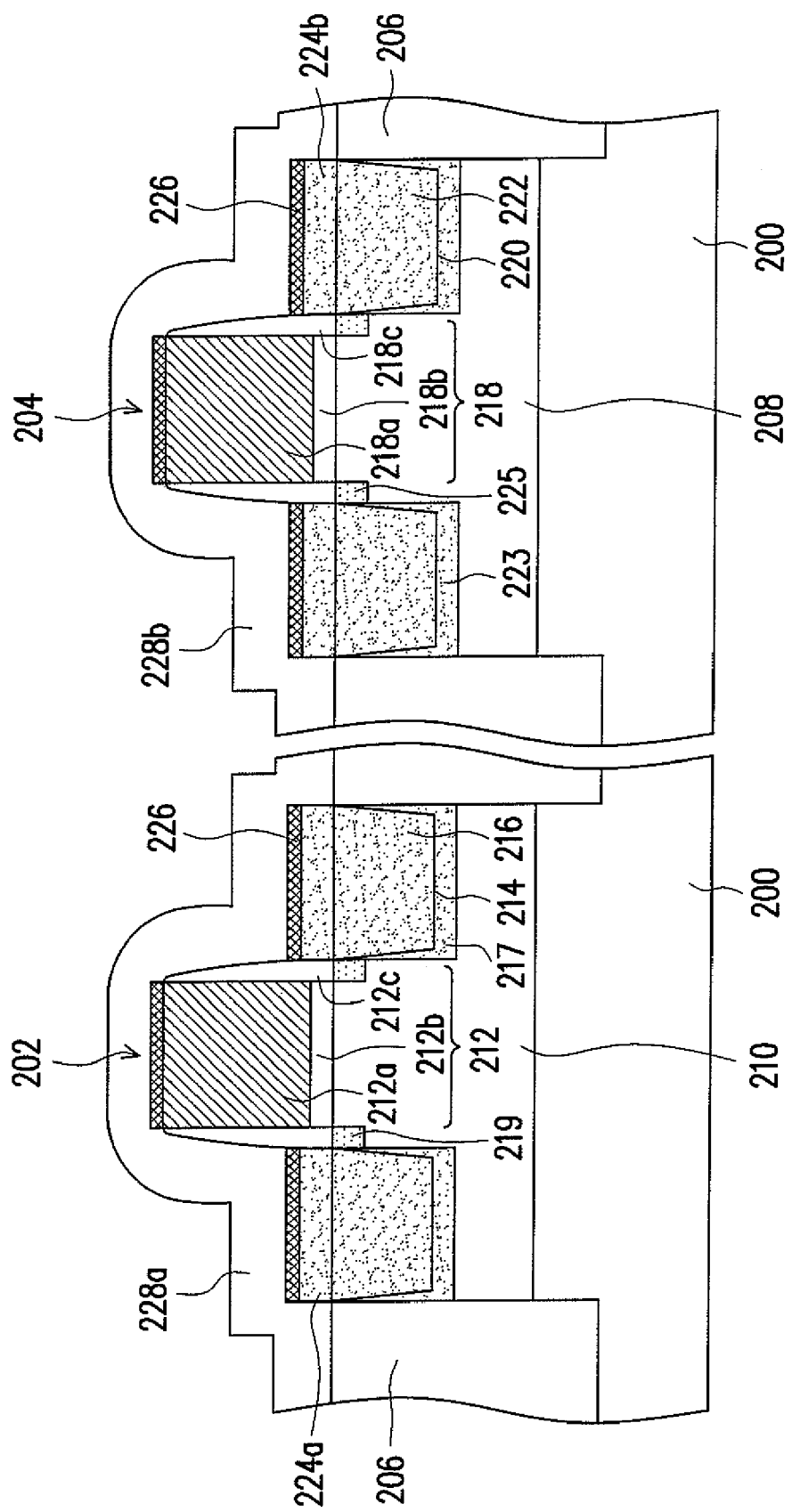
FIG. 2 illustrates a cross-sectional view of a semiconductor structure according to an embodiment of this invention.

Referring to FIG. 2, the semiconductor structure of this embodiment includes a substrate 200, a MOS transistor 202 of a first conductivity type, a MOS transistor 204 of a second conductivity type and an isolation structure 206. The substrate 200 has a well 208 of the first conductivity type and a well 210 of the second conductivity type therein. The MOS transistor 202 is disposed on the well 210, including a gate structure 212 on the well 210 and a doped strained layer 216 of the first conductivity type. The gate structure 212 includes a gate 212a on the substrate 200, gate dielectric 212b between the gate 212a and the substrate 200 and a spacer 212c on the sidewall of the gate 212a, and an opening 214 is formed in the well 210 beside the gate structure 212. The gate 212a may include poly-Si or metal, the gate dielectric 212b may include SiO, SiN or SiON, and the spacer 212c may include SiN.

The strained layer 216 is disposed in the opening 214 serving as a part of the S/D region of the MOS transistor 202, wherein the difference between the cell parameter of a portion of the strained layer 216 near the bottom of the opening 214 and the cell parameter of the substrate 200 is smaller than the difference between the cell parameter of a portion of the strained layer 216 apart from the bottom of the opening 214 and the cell parameter of the substrate 200. It is more preferred that the cell parameter of the strained layer 216 has a gradient distribution. When the first conductivity type is P-type, the strained layer 216 is a compressively strained layer, wherein a portion of the strained layer 216 near the bottom of the opening 214 has a cell parameter equal to or larger than that of the substrate 200 but smaller than that of a portion of the strained layer 216 apart from the bottom of the opening 214. When the first conductivity type is N-type, the strained layer 216 is a tensily strained layer, wherein a portion of the strained layer 216 near the bottom of the opening 214 has a cell parameter equal to or smaller than that of the substrate 200 but larger than that of a portion of the strained layer 216 apart from the bottom of the opening 214. The MOS transistor 202 also includes a doped region 217 of the first conductivity type under and around the opening 214 as another part of its S/D region, and an S/D extension region 219 of the first conductivity type in the well 210 under the spacer 212c.

The MOS transistor 204 is disposed on the well 208. The isolation structure 206 is disposed in the substrate 200 to define the active areas of the devices, and may be an STI structure or other type of isolation structure. The MOS transistor 204 includes a gate structure 218 and a doped strained layer 222 of the second conductivity type. The gate structure 218 is disposed on the well 208, and an opening 220 is formed in the well 208 beside the gate structure 218. The gate structure 218 includes gate dielectric 218b, a gate 218a on the gate dielectric 218b and a spacer 218c on the sidewall of the gate 218a, wherein possible materials of 218a, 218b and 218c are the same as above.

The strained layer 222 is disposed in the opening 220 serving as a part of the S/D of the MOS transistor 204. Similarly, the difference between the cell parameter of a portion of the strained layer 222 near the bottom of the opening 220 and the cell parameter of the substrate 200 is smaller than the difference between the cell parameter of a portion of the strained layer 222 apart from the bottom of the opening 220 and the cell parameter of the substrate 200. However, the cell parameter of the strained layer 222 changes reversely with respect to that of the strained layer 216. Specifically, when the first conductivity type is P-type and the second one N-type, the strained layer 216 is a compressively strained layer with the cell parameter increasing toward its top, while the strained layer 222 is a tensily strained layer with the cell parameter decreasing toward its top. When the first conductivity type is N-type and the second one P-type, the strained layer 216 is a tensily strained layer just mentioned, while the strained layer 222 is a compressively strained layer just mentioned. The MOS transistor 204 also includes a doped region 223 of the second conductivity type under and around the opening 220 as another part of the S/D region of the MOS transistor 204, and an S/D extension region 225 of the second conductivity type in the well 208 under the spacer 218c.

It is noted that in this embodiment, when the first conductivity type is P-type and the second one N-type, the compressively strained layer 216 may include SiGe that is larger in cell parameter relative to pure silicon, while the tensily strained layer 222 may include SiC that is smaller in cell parameter relative to pure silicon. When the first conductivity type is N-type and the second one P-type, the tensily strained layer 216 may include SiC, while the compressively strained layer 222 may include SiGe.

Moreover, on the strained layers 216 and 222 two silicon layers 224a and 224b with corresponding conductivity types may be disposed respectively, and a metal silicide layer 226 may further be disposed on the silicon layers 224a and 224b and the gate structures 212 and 218. The thickness of the silicon layer 224a or 224b may range from 100 Å to 500 Å. The material of the metal silicide layer 226 may be WSi, TiSi, MoSi, NiSi, PdSi or PtSi. Moreover, contact etching stop layers 228a and 228b may further be disposed over the substrate 200 covering the resulting structure. The material of the contact etching stop layer 228a or 228b may be SiN, and the contact etching stop layer 228a/228b may be a compressive or tensile layer for increasing the carrier mobility in the channel layer of the MOS transistor 202/204 and thereby further improves the performance of the MOS transistor 202/204.

An example of fabricating the semiconductor structure in FIG. 2 is described as follows. Since the left half and the right half of the semiconductor structure is similar in structure, the fabricating process of the left half is described firstly.

Figure 3A:
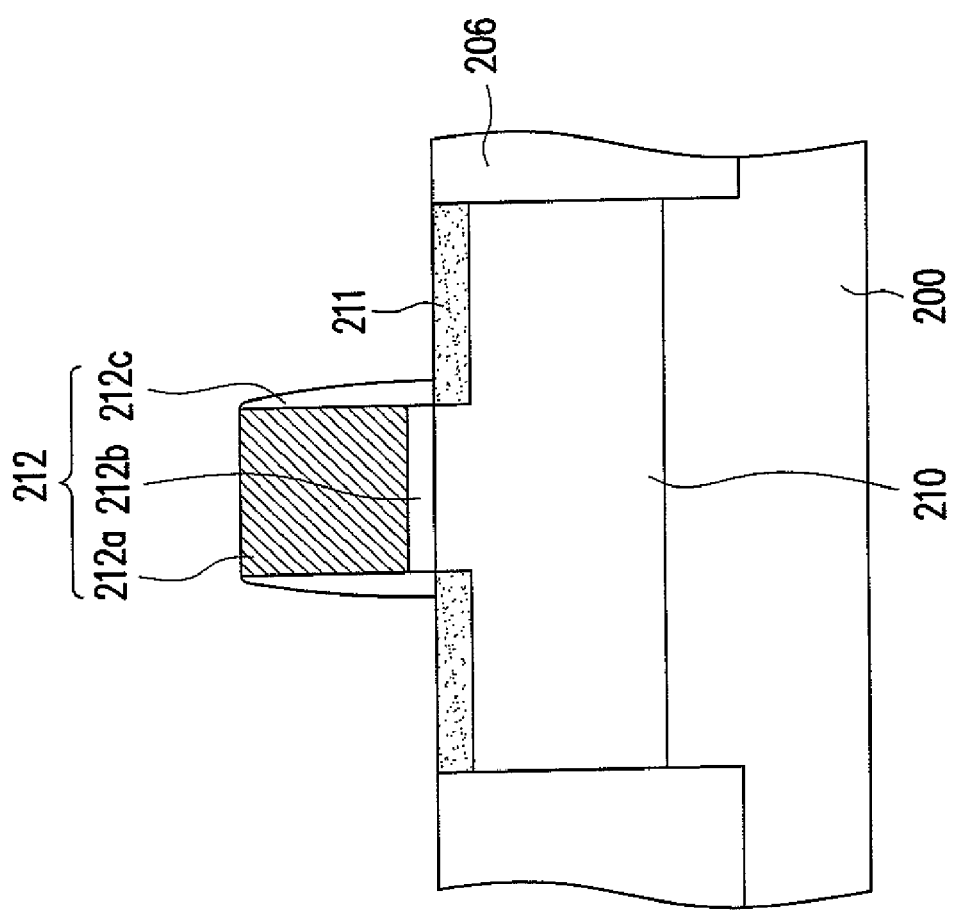
FIGS. 3A-3C illustrate, in a cross-sectional view, a process flow of fabricating the MOS transistor 202 in FIG. 2 according to an embodiment of this invention.
Figure 3B:
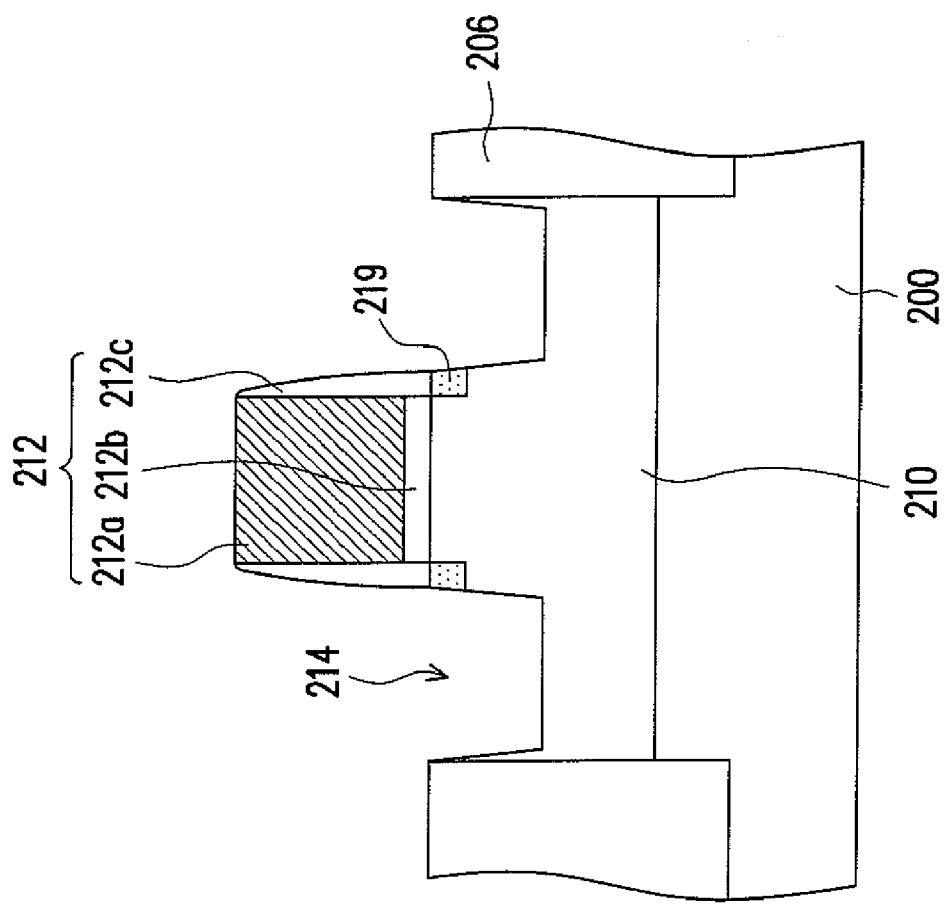
Figure 3C:
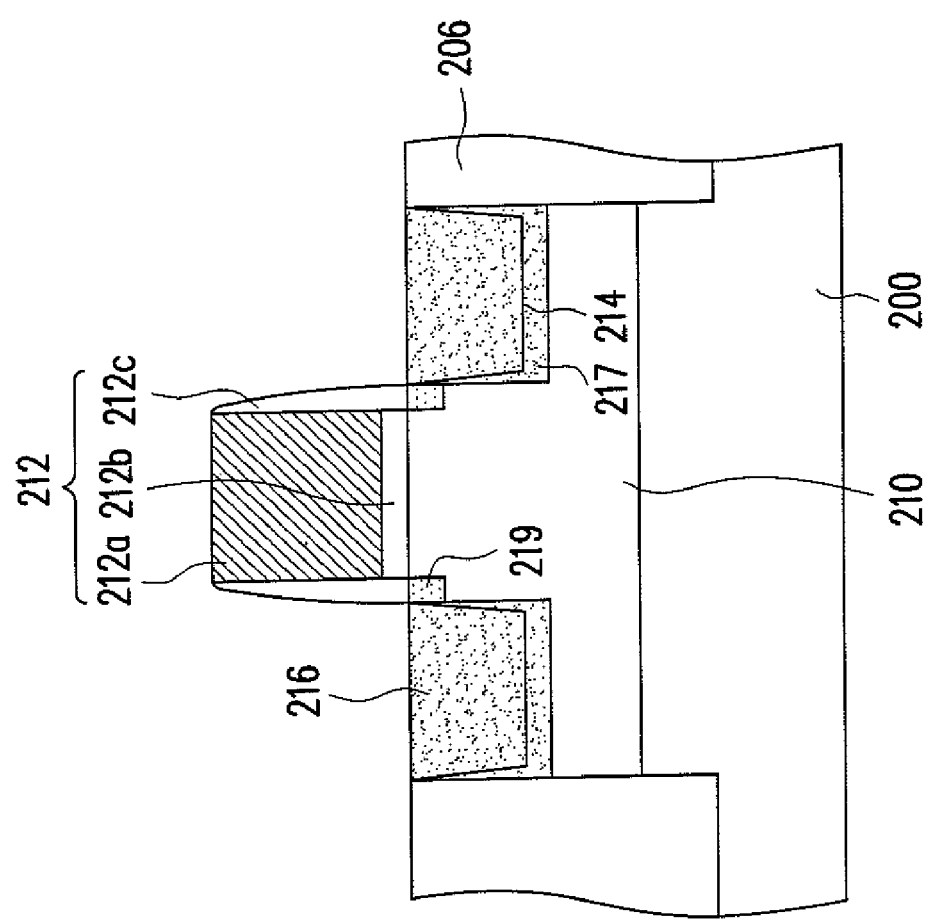

FIGS. 3A-3C illustrate, in a cross-sectional view, a process flow of fabricating the MOS transistor 202 in FIG. 2. Referring to FIG. 3A, a substrate 200 is provided, having therein a well of the first conductivity type (not shown), a well 210 of the second conductivity type and an isolation structure 206 defining the active areas of the devices. The wells can be formed through ion implantation, and the isolation structure 206 may be formed through an STI process. A gate 212a and gate dielectric 212b are formed on the well 210, possibly by forming a layer of gate dielectric material and a gate material layer on the substrate 200 and then sequentially patterning the two layers.

Referring to FIG. 3A again, a doped region 211 of the first conductivity type is formed in the well 210 beside the gate 212a, possibly through an ion implantation with the gate 212a as a mask. A spacer 212c is formed on the sidewall of the gate 212a, constituting a gate structure 212 together with the gate 212a and gate dielectric 212b.

Referring to FIG. 3B, a portion of the substrate 200 beside the gate structure 212 is removed to form an opening 214, while a portion of the doped region 211 is removed to form an S/D extension region 219. The opening 214 may be formed with the following steps. A patterned photoresist layer (not shown) is formed over the substrate 200, exposing the gate structure 212 and the region for forming the opening 214. An etching process is conducted with the gate structure 212 and the patterned photoresist layer as a mask to remove a portion of the substrate 200, wherein the etching may be isotropic, anisotropic or tilted etching. The depth of the opening 214 is usually 100-1000 Å, preferably 300-500 Å.

Referring to FIG. 3C, ion implantation is conducted with the gate structure 212 as a mask to implant a dopant of the first conductivity type into a portion of the substrate 200 under and around the opening 214 to form a doped region 217 as a part of the S/D region of the MOS transistor 202. It is particularly noted that the above ion implantation can alternatively be conducted before the opening 214 is formed, wherein the depth of the opening 214 has to be controlled smaller than that of the implantation.

Thereafter, a first epitaxy process is conducted with a first mixed gas to form a strained layer 216 in the opening 214, wherein the first mixed gas includes a first gas containing silicon and a second gas containing a first IV-group element and the percentage of the second gas in the first mixed gas is increased with time during the first epitaxy process. The first gas is, for example, silane or disilane. The first mixed gas preferably further includes a first doping gas so that the strained layer 216 is formed having the first conductivity type. When the first conductivity type is P-type, the first IV-group element is one having an atomic size larger than that of silicon, such as Ge, so that the cell parameter is increased and a compressively strained layer 216 is formed with improved hole mobility. When the first conductivity type is N-type, the IV-group element is carbon that is smaller than silicon in atomic size, so that the cell parameter is decreased and a tensily strained layer 216 is formed with improved electron mobility.

The fabricating process of the MOS transistor 204 is analogous to that of the MOS transistor 202. The main differences are that the MOS transistor 204 has an opposite conductivity type and the strained layer 222 thereof is formed with a second epitaxy process that uses a second mixed gas that includes the first gas containing Si and a third gas containing a second IV-group element. Similarly, the second mixed gas may further include a second doping gas, so that the strained layer 222 is formed having the second conductivity type. To respectively form a compressively strained layer required by PMOS and a tensily strained layer required by NMOS, when the first conductivity type is P-type and the second one N-type, the atomic size of the first IV-group element is larger than that of silicon to result in a larger cell parameter, while the second IV-group element is carbon that has an atomic size smaller than that of silicon to result in a smaller cell parameter. On the contrary, when the first conductivity type is N-type and the second one P-type, the first IV-group element is carbon, and the atomic size of the second IV-group element is larger than that of silicon.

Moreover, when the first conductivity type is P-type and the second one N-type, the second gas may be $GeH_4$, and the second gas in the first mixed gas may be increased from 0 to 40% with time during the first epitaxy process, while the first doping gas may be $B_2H_6$. The third gas may be $CH_4$ or $C_2H_6$, and the third gas in the second mixed gas may be increased from 0 to 20% with time during the second epitaxy process, while the second doping gas may be $PH_3$.

On the contrary, when the first conductivity type is N-type and the second one P-type, the second gas may be $CH_4$ or $C_2H_6$, and the second gas in the first mixed gas may be increased from 0 to 20% with time during the first epitaxy process, while the first doping gas may be $PH_3$. The third gas may be $GeH_4$ and the third gas in the second mixed gas may be increased from 0 to 40% with time during the second epitaxy process, while the second doping gas may be $B_2H_6$.

It is also noted that the MOS transistors 202 and 204 are not restricted to form in two separate processes. The fabricating process of the MOS transistor 202 is usually integrated more or less with that of the MOS transistor 204 for step simplification.

After the MOS transistor 202 (or 204) is formed, a silicon layer 224a (or 224b) of the same conductivity type may be further formed on the strained layer 216 (or 222), as shown in FIG. 2. The silicon layer 224a (or 224b) may be formed directly in the first (or second) epitaxy process by stopping supplying the second (or third) gas after the strained layer 216 (or 222) is formed but continuing to supply the Si-containing first gas and the first (or second) doping gas for epitaxy. After the silicon layers 224a and 224b are formed, a metal silicide layer 226 can be further formed, possibly through a salicide process, on the silicon layers 224a and 224b and the gate structures 212 and 218, as shown in FIG. 2. After the metal silicide layer 226 is formed, contact etching stop layers 228a and 228b may be formed over the substrate 200 covering the resulting structure, as shown in FIG. 2, possibly through chemical vapor deposition (CVD).

It is also noted that the MOS transistor 202 of the first conductivity type having a strained S/D region of non-uniform cell parameter is not restricted to form together with a MOS transistor of the second conductivity type also having a strained S/D region of non-uniform cell parameter. The MOS transistor 202 may alternatively be formed together with a structurally different MOS transistor of the second conductivity type. Such examples are described in the following embodiments.

Figure 4:
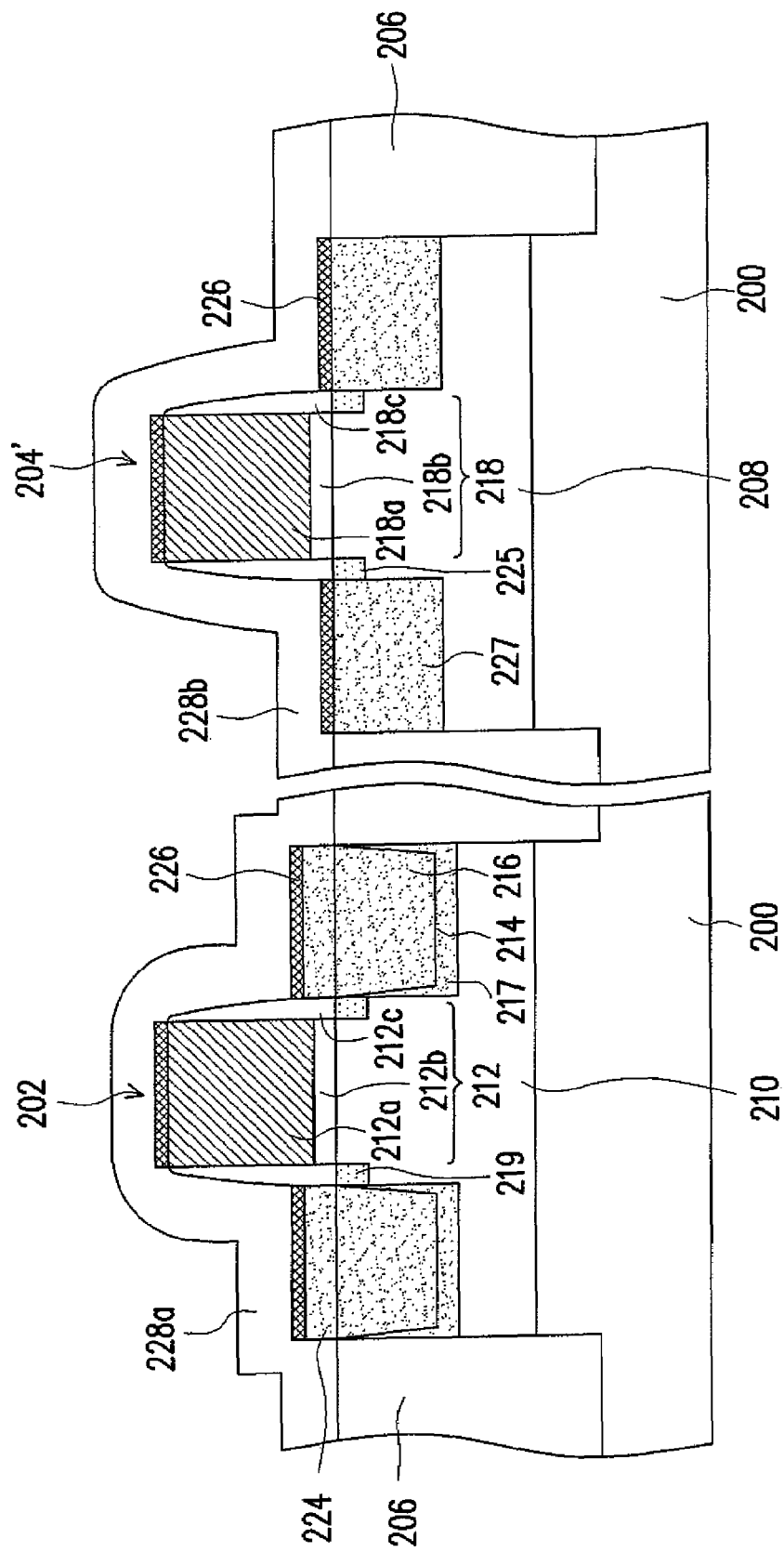
FIG. 4 illustrates a cross-sectional view of a semiconductor structure according to another embodiment of this invention.

FIG. 4 illustrates a cross-sectional view of a semiconductor structure according to another embodiment of this invention. The MOS transistor 204' in replacement of the MOS transistor 204 includes a gate structure 218 as mentioned above and an S/D region 227 in the well 208 beside the gate structure 218. The MOS transistor 204' also includes an S/D extension region 225 of the second conductivity type in the well 208 under the spacer 218c. Similarly, in this embodiment, the strained layer 216 may also be formed with a silicon layer 224 thereon, and then a metal silicide layer 226 may be further formed on the silicon layer 224, the S/D region 227 and the gate structures 212 and 218. The thickness of the silicon layer 224 and the material of the metal silicide layer 226 may be the same as above. Moreover, two contact etching stop layers 228a and 228b, such as SiN layers formed with different recipes to have different stresses, can be formed over the substrate 200 covering the MOS transistors 202 and 204'.

The MOS transistor 204' may be formed by forming a gate structure 218 on the well 208 and then forming, possibly through an ion implantation process using the gate structure 218 as a mask, an S/D region 227 of the second conductivity type in the well 208 beside the gate structure 218.

Figure 5:
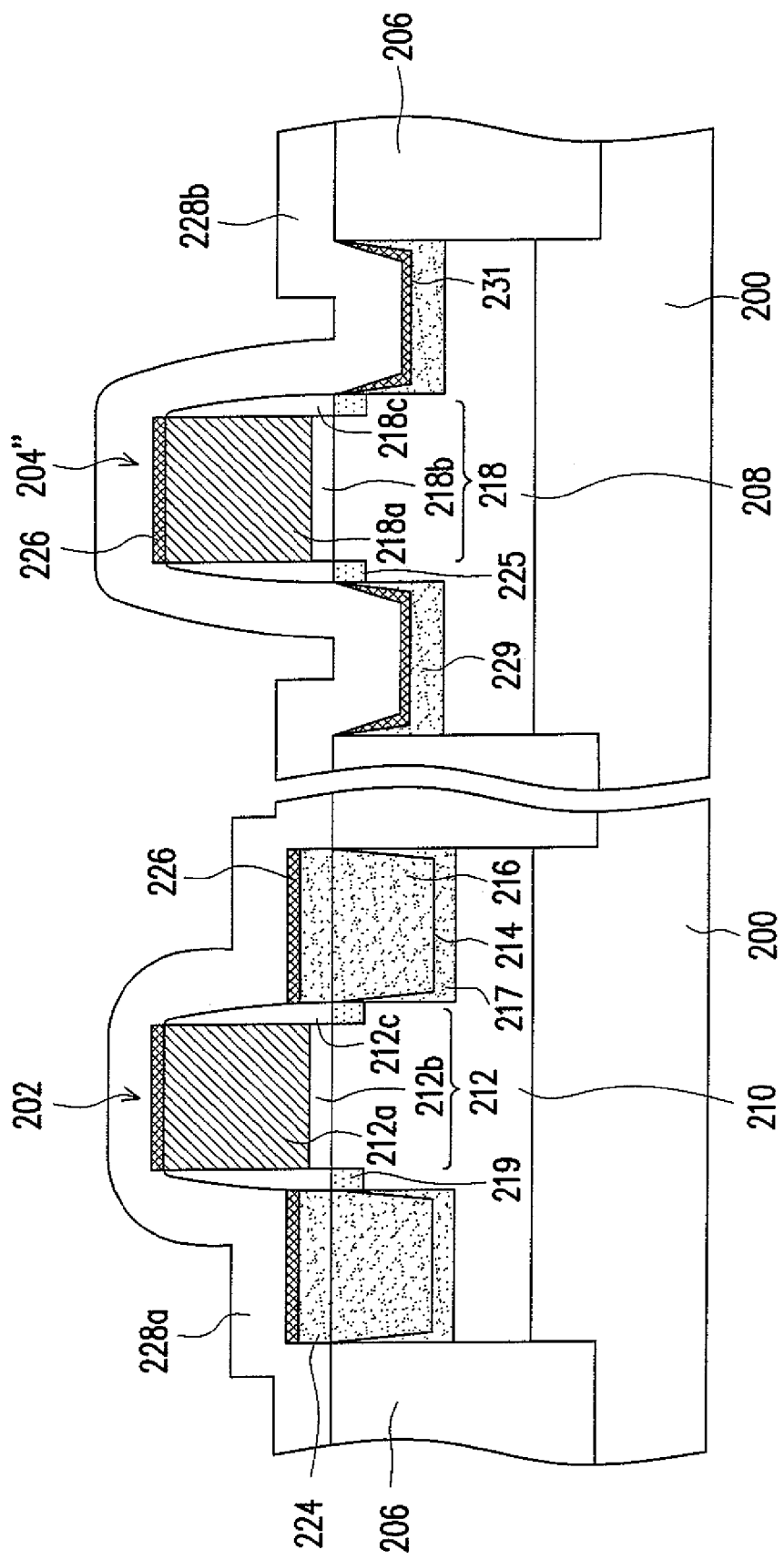
FIG. 5 illustrates a cross-sectional view of a semiconductor structure according to still another embodiment of this invention.

FIG. 5 illustrates a cross-sectional view of a semiconductor structure according to yet another embodiment of this invention. The MOS transistor 204" in replacement of the MOS transistor 204 includes a gate structure 218 as mentioned above and an S/D region 229 in the well 208 under and around an opening 231 beside the gate structure 218. The transistor 204" also includes an S/D extension region 225 of the second conductivity type in the well 208 under the spacer 218c. In the present embodiment, the strained layer 216 may similarly be formed with a silicon layer 224 thereon, and then a metal silicide layer 226 may be further formed on the silicon layer 224, the S/D region 229 and the gate structures 212 and 218. The thickness of the silicon layer 224 and the material of the metal silicide layer 226 may be the same as above. Moreover, contact etching stop layers 228a and 228b as mentioned above may be further formed over the substrate 200 covering the MOS transistors 202 and 204", respectively. The contact etching stop layer 228b preferably has a thickness at least sufficient to fill up the opening 231 to apply a sufficient large stress to the channel layer of the MOS transistor 204" and effectively increase the carrier mobility in the channel layer thereby.

In addition, the MOS transistor 204" may be formed with the following steps. A gate structure 218 is formed on the well 208, a portion of the substrate 200 beside the gate structure 218 is removed to form an opening 231, and then an S/D region 229 of the second conductivity type is formed in the well 208 under and around the opening 231, possibly with an ion implantation process using the gate structure 218 as a mask.

It is also noted that the MOS transistors 202 and 204' (or 204") are either not restricted to form in two separate processes. The fabricating process of the MOS transistor 202 is usually integrated more or less with that of the MOS transistor 204' (or 204") for step simplification.

Nevertheless, it is particularly noted that the MOS transistor 202 with a strained S/D region of non-uniform cell parameter can alternatively be formed together with a MOS transistor of opposite conductivity type that has a structure similar to that of the MOS transistor 204 in FIG. 2 but has a strained S/D region of uniform cell parameter.

Accordingly, in the epitaxy process for forming a strained layer as an S/D region in this invention, the percentage of the gas containing the non-silicon IV-group element in the mixed gas for epitaxy is increased with time. Thereby, the difference between the cell size of a portion of the strained layer near the bottom of the opening and the cell size of the substrate is smaller than the difference between the cell size of a portion of the strained layer apart from the bottom of the opening and the cell size of the substrate. Thus, less defects occur at the interface of the strained layer and the substrate.

Moreover, since a silicon layer is formed on the strained layer before the metal silicide layer is formed, the non-silicon IV-group element does not enter the metal silicide layer in the salicide process, so that the quality of the metal silicide layer is not degraded.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a semiconductor structure, comprising:
    providing a substrate that has therein a first well of a first conductivity type and a second well of a second conductivity type;
    forming a first gate structure on the second well;
    removing a portion of the substrate beside the first gate structure to form a first opening;
    performing a first epitaxy process with a first mixed gas to form in the first opening a first strained layer comprising silicon and a first IV-group element, wherein the first mixed gas comprises a first gas containing silicon and a second gas containing the first IV-group element and the percentage of the second gas in the first mixed gas is increased with time during the first epitaxy process; and
    forming a MOS transistor of the second conductivity type on the first well, comprising:
        forming a second gate structure on the first well;
        removing a portion of the substrate beside the second gate to form a second opening; and
        forming a source/drain region of the second conductivity type in the first well around and under the second opening.

2. The method of claim 1, wherein the first conductivity type is P-type, and the atomic size of the first IV-group element is larger than the atomic size of silicon.

3. The method of claim 1, wherein the first conductivity type is N-type, and the first IV-group element is carbon.

4. The method of claim 1, wherein the first mixed gas further comprises a first doping gas so that the first strained layer is formed having the first conductivity type.

5. The method of claim 1, further comprising
    forming a silicon layer on the first strained layer; and
    forming a metal silicide layer on the silicon layer, the S/D region and the first and the second gate structures.

6. The method of claim 1, wherein forming the MOS transistor of the second conductivity type further comprises:
    performing a second epitaxy process with a second mixed gas to form in the second opening a second strained layer comprising silicon and a second IV-group element, wherein the second mixed gas comprises the first gas containing silicon and a third gas containing the second IV-group element and the percentage of the third gas in the second mixed gas is increased with time during the second epitaxy process,
    wherein when the first conductivity type is P-type and the second conductivity type is N-type, the atomic size of the first IV-group element is larger than the atomic size of silicon and the second IV-group element is carbon; when the first conductivity type is N-type and the second conductivity type is P-type, the first IV-group element is carbon and the atomic size of the second IV-group element is larger than the atomic size of silicon.

7. The method of claim 6, wherein the second mixed gas further comprises a second doping gas so that the second strained layer is formed having the second conductivity type.

8. The method of claim 7, further comprising
    forming a silicon layer on the first strained layer and the second strained layer; and
    forming a metal suicide layer on the silicon layer and the first and the second gate structures.

* * * * *